(12) United States Patent
Lee et al.

(10) Patent No.: US 8,184,264 B2
(45) Date of Patent: May 22, 2012

(54) CALIBRATION METHODS AND DEVICES USEFUL IN SEMICONDUCTOR PHOTOLITHOGRAPHY

(75) Inventors: Chung-Yi Lee, Boise, ID (US); Ezequiel Vidal-Russell, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 560 days.

(21) Appl. No.: 12/325,929

(22) Filed: Dec. 1, 2008

(65) Prior Publication Data

US 2010/0134774 A1 Jun. 3, 2010

(51) Int. Cl.
*G03B 27/52* (2006.01)
*G03B 27/32* (2006.01)

(52) U.S. Cl. .......................................... 355/55; 355/77
(58) Field of Classification Search .................... 355/55, 355/77
See application file for complete search history.

(56) References Cited

U.S. PATENT DOCUMENTS

| | | | |
|---|---|---|---|
| 5,556,726 A | 9/1996 | Yuan | |
| 5,673,101 A | 9/1997 | Tenner et al. | |
| 6,701,512 B2 | 3/2004 | Sutani et al. | |
| 6,964,032 B2* | 11/2005 | Liebmann et al. | 716/53 |
| 7,126,668 B2 | 10/2006 | Smith et al. | |
| 2002/0021434 A1* | 2/2002 | Nomura et al. | 355/55 |
| 2010/0002214 A1* | 1/2010 | Kim | 355/55 |

FOREIGN PATENT DOCUMENTS

| | | |
|---|---|---|
| EP | 0469765 A1 | 2/1992 |
| EP | 0985977 A1 | 3/2000 |

OTHER PUBLICATIONS

Dirksen, P. et al., "Focus and Exposure Dose Determination Using Stepper Alignment," Proceedings of SPIE, Optical Microlithography IX, Gene E. Fuller, Ed., vol. 2726, pp. 799-808, Jun. 7, 1996.
Hickman, K.C. et al. "Use of Diffracted Light From Latent Images to Improve Lithography Control," Journal of Vacuum Science and Technology: Part B, vol. 10, No. 5, pp. 2259-2266, Sep. 1, 1992.
Pugh, G.M. et al., "Detailed Study of a Phase-Shift Focus Monitor," Proceedings of SPIE, Optical/Laser Microlithography VIII, Timothy A. Brunner, Ed., vol. 2440, pp. 690-700, May 26, 1995.
Sturtevant, J.L. et al., "Post-Exposure Bake as a Process-Control Parameter for Chemically-Amplified Photoresist," Proceedings of SPIE, Integrated Circuit Metrology, Inspection, and Process Control VII, Michael T. Postek, Ed., vol. 1926, pp. 106-114, Aug. 4, 1993.

(Continued)

*Primary Examiner* — Edward Glick
*Assistant Examiner* — Michelle Iacoletti
(74) *Attorney, Agent, or Firm* — Perkins Coie LLP

(57) ABSTRACT

Several embodiments of photolithography devices and associated methods of focal calibration are disclosed herein. In one embodiment, a method for determining a focus shift in a photolithography system include placing a microelectronic substrate on a substrate support of the photolithography system and producing first and second refraction patterns on the photoresist layer corresponding to first and second grating patterns, respectively, of a single reticle by illuminating the first and second grating patterns with an asymmetric monopole source perpendicular to the first and second grating patterns. The method further includes measuring an image shift between the first and second refraction patterns on the photoresist layer and determining a defocus shift of the illumination source based on the image shift.

19 Claims, 4 Drawing Sheets

OTHER PUBLICATIONS

Zaidi, S.H. et al., "Metrology Sensors for Advanced Resists," Proceedings of SPIE, Integrated Circuit Metrology, Inspection, and Process Control VIII, Marylyn H. Bennett, Ed., vol. 2196, pp. 341-351, May 1, 1994.

Levinson, Harry J., Lithography Process Control, Tutorial Texts in Optical Engineering, vol. TT28, SPIE—The International Society for Optical Engineering, 1999, pp. 57-86, ISBN 0-8194-3052-8.

* cited by examiner

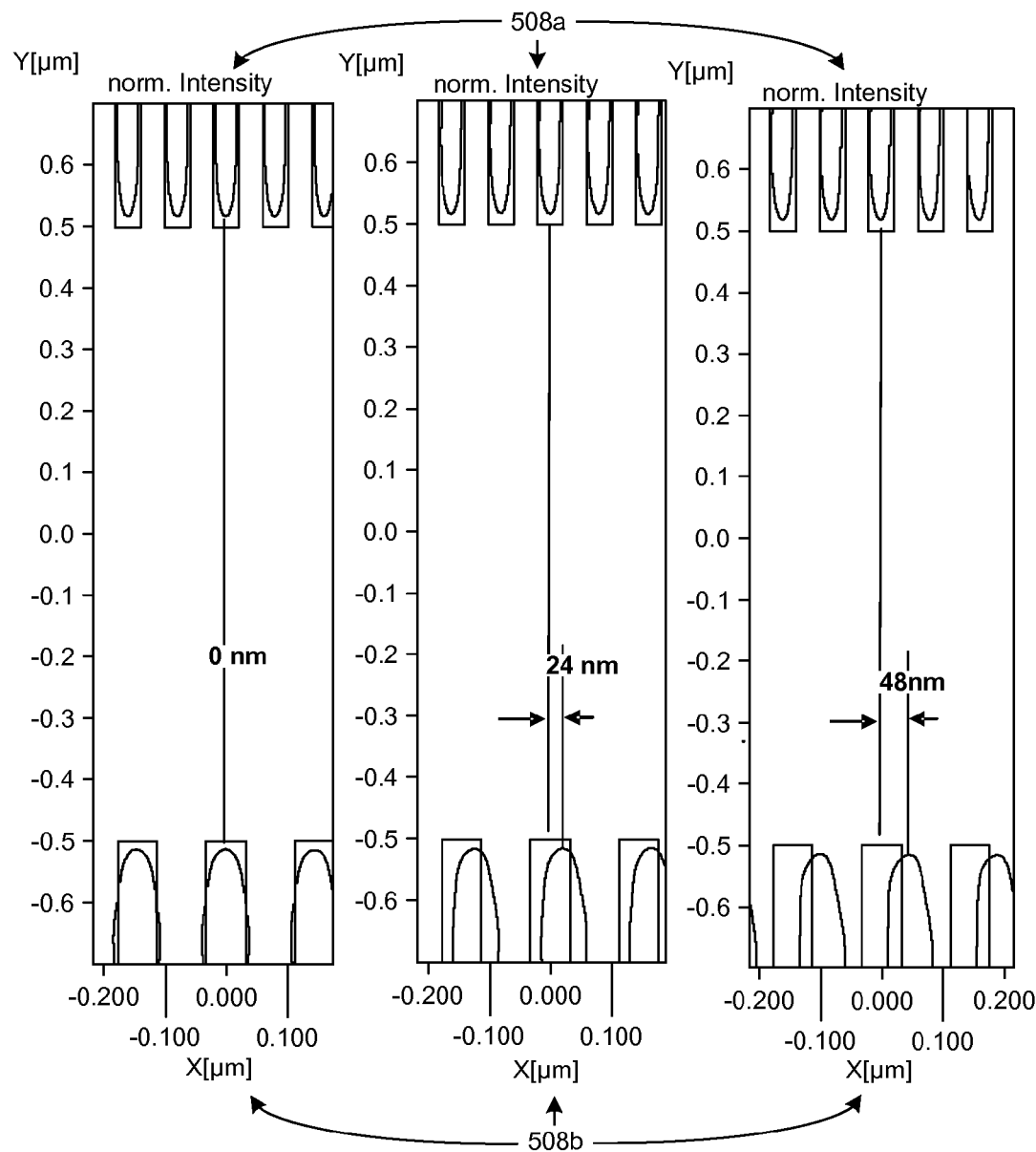
*FIG. 5A*  *FIG. 5B*  *FIG. 5C*

US 8,184,264 B2

CALIBRATION METHODS AND DEVICES USEFUL IN SEMICONDUCTOR PHOTOLITHOGRAPHY

TECHNICAL FIELD

The present disclosure is related to photolithography devices and associated methods of focal calibration.

BACKGROUND

Photolithography is a process commonly used in semiconductor fabrication for selectively removing portions of a film from or depositing portions of a film onto a semiconductor wafer. A typical photolithography process can include spin coating a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer.

The size of individual components in semiconductor devices is constantly decreasing in the semiconductor industry. To accommodate the ever smaller components, semiconductor manufacturers and photolithography tool providers have produced higher numerical aperture (NA) photolithography systems using smaller wavelengths (e.g., 193 nm). The high NA has improved the resolution of the photolithography systems, but this enhancement in resolution comes at the expense of the overall focus budget. As a result, the focus and/or exposure control must be very precise to avoid reducing product yields. Therefore, the focus of photolithography systems must be calibrated accurately and efficiently.

BRIEF DESCRIPTION OF THE DRAWINGS

FIGS. 5A-C are schematic top views illustrating simulation results for calibrating the system of FIG. 1 in accordance with an embodiment of the disclosure.

DETAILED DESCRIPTION

Various embodiments of photolithography systems for processing microelectronic substrates and associated methods of calibration are described below. The term "microelectronic substrate" is used throughout to include substrates upon which and/or in which microelectronic devices, micromechanical devices, data storage elements, read/write components, and other features are fabricated. Such a microelectronic substrate can include one or more conductive and/or nonconductive materials (e.g., metallic, semiconductive, and/or dielectric materials) that are situated upon or within one another. These conductive and/or nonconductive materials can also include a wide variety of electrical elements, mechanical elements, and/or systems of such elements in the conductive and/or nonconductive materials (e.g., an integrated circuit, a memory, a processor, a microelectromechanical system, etc.) The term "reticle" generally refers to a plate with areas of varying transparencies that allow light to shine through in a defined pattern. The term "photoresist" generally refers to a material that can be chemically modified when exposed to electromagnetic radiation. The term encompasses both positive photoresist configured to be soluble when activated by the electromagnetic radiation and negative photoresist configured to be insoluble when activated by light. A person skilled in the relevant art will also understand that the disclosure may have additional embodiments, and that the disclosure may be practiced without several of the details of the embodiments described below with reference to FIGS. 1-5.

Figure 2A:
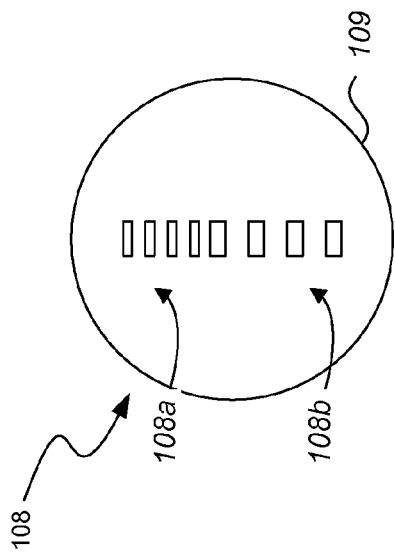
FIGS. 2A and 2B are schematic top views of a calibration reticle useful in the system of FIG. 1 in accordance with embodiments of the disclosure.
Figure 2B:
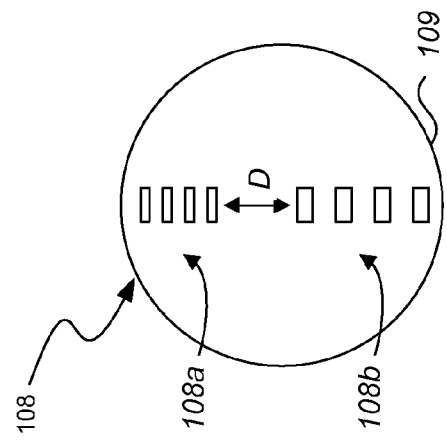
Figure 1:
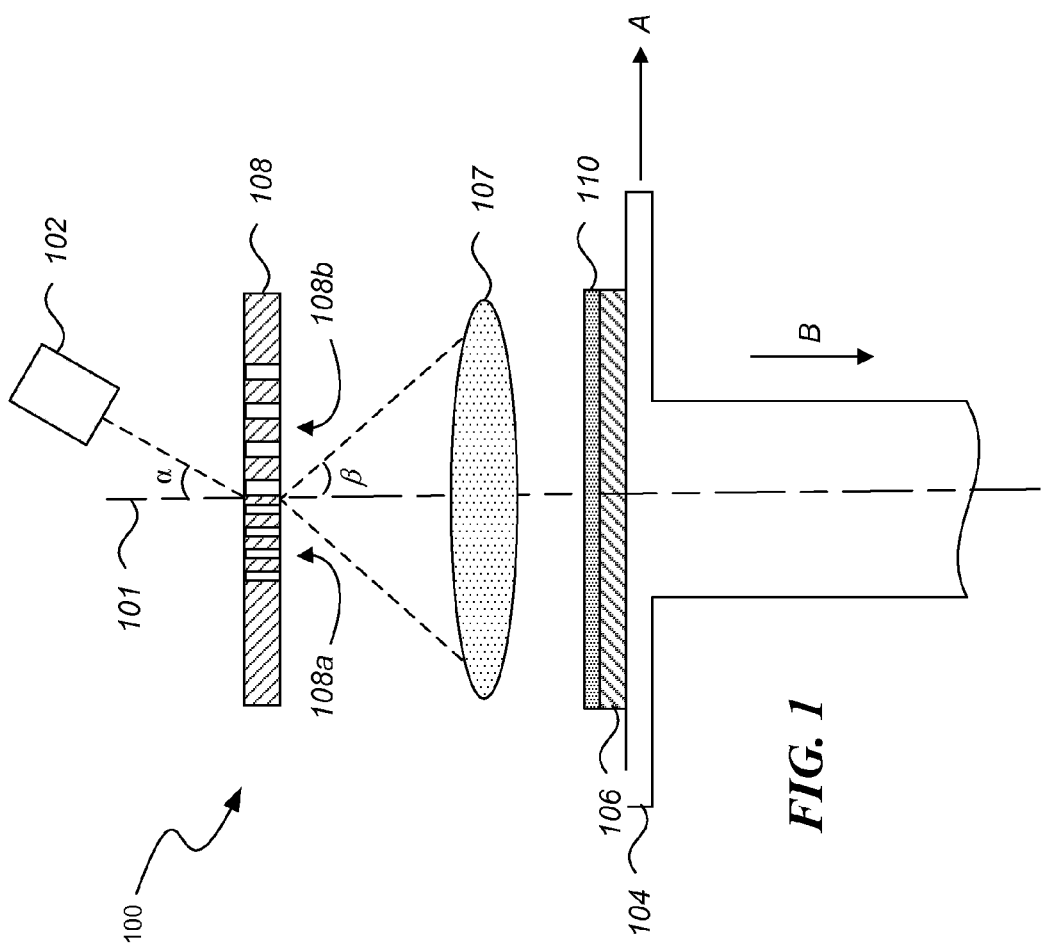
FIG. 1 is a schematic view of a photolithography system configured in accordance with an embodiment of the disclosure.

FIG. 1 is a schematic view of an embodiment of a photolithography system 100 configured in accordance with an embodiment of the disclosure. FIGS. 2A and 2B are schematic top views of a reticle 108 useful in the system 100 of FIG. 1 in accordance with an embodiment of the disclosure. As shown in FIG. 1, the system 100 can include an illumination source 102, a reticle 108, an objective lens 107, and a substrate support 104 arranged in series about an axis 101. The substrate support 104 can be configured to carry a microelectronic substrate 106 having a layer of photoresist 110. In one embodiment, the substrate support 104 can be stationary. In other embodiments, the substrate support 104 can move laterally (as indicated by the arrow A) and/or vertically (as indicated by the arrow B) relative to the reticle 108.

The illumination source 102 can include an ultraviolet light source (e.g., a fluorescent lamp), a laser source (e.g., an argon fluoride excimer laser), and/or other suitable electromagnetic emission sources. The illumination source 102 can also include condensing lenses, collimators, mirrors, and/or other suitable conditioning components (not shown). In several embodiments, the illumination component 102 can include an asymmetric monopole source with a numerical aperture ($NA_{source}$) defined as follows:

$$NA_{source} = \sin \alpha \quad \text{(Equation 1)}$$

where $\alpha$ is a maximum incident angle between emitted waves from the illumination source 102 and the axis 101.

In certain embodiments, the illumination source 102 can be configured to produce a generally coherent illumination at a single frequency ($\lambda$). The phrase "coherent illumination" generally refers to illumination with waves that arrive at a receiving component (e.g., the reticle 108) at approximately the same phase angle. In the illustrated embodiment, the illumination source 102 is offset from the axis 101 by an angle $\alpha$. In other embodiments, the illumination source 102 can also be generally centered about the axis 101 and at least partially incoherent. The phrase "partially incoherent" generally refers to waves of illumination that do not arrive at a receiving component completely in phase. For example, the illumination source 102 can have a finite physical size and generate waves incident upon the reticle 108 with different phase angles. In further embodiments, the illumination source 102 can also be configured to generate illumination at multiple frequencies.

The reticle 108 can include a substrate having a first grating pattern 108a adjacent to a second grating pattern 108b. The term "grating" generally refers to a regularly spaced collection of generally parallel slits, channels, openings, and/or other transparent or semi-transparent elements. For example, in one embodiment, the reticle 108 includes a substrate (e.g., quartz) carrying a layer of a generally opaque material (e.g., chromium) with certain portions removed to form parallel slits, channels, openings, and/or other patterns on the substrate. In other embodiments, the reticle 108 can include a first layer of a semi-opaque material (e.g., molybdenum) and a second layer of a generally opaque material (e.g., chromium). Certain portions of the first and/or second layers may be removed form parallel slits, channels, opening, and/or other desired patterns on the substrate.

The first grating pattern 108a can have different characteristics than the second grating pattern 108b. For example, the first grating pattern 108a can have a first pitch different than a second pitch of the second grating pattern 108b. The term "pitch" generally refers to a distance between two adjacent grating elements. In other examples, the first and second grating patterns can have different transparencies and/or other characteristics. Several embodiments of the reticle 108 are described in more detail below with reference to FIGS. 2A and 2B.

The objective lens 107 can be configured to project the illumination refracted from the reticle 108 onto the photoresist 110 of the microelectronic substrate 106. The objective lens 107 can have an objective numerical aperture defined as follows:

$$NA_{objective} = \sin \beta \quad \text{(Equation 2)}$$

where $\beta$ is an angle for a field of view of the objective lens 107. Equation 2 assumes that the objective lens 107 and the illumination source 102 are disposed in the same medium. One skilled in the art would understand that if these components are disposed in different media, their numerical apertures can be adjusted accordingly with the indices of the media.

The system 100 can be configured such that the zeroth-order refraction from the reticle 108 can be offset from the axis 101. For example, in certain embodiments, the illumination source 102 of the system 100 can be at least partially incoherent. In other embodiments, the illumination source 102 can be coherent but off-axis with respect to the reticle 108. In all of these embodiments, the system 100 can have a partial incoherency represented as follows:

$$\sigma = \frac{NA_{source}}{NA_{objective}} \quad \text{(Equation 3)}$$

In other embodiments, the system 100 can be configured such that the zeroth-order refraction of waves from the illumination source 102 can be generally aligned with the axis 101, and the first and second orders can be offset from the axis 101.

FIGS. 2A and 2B are schematic top views of a reticle 108 useful in the system of FIG. 1 in accordance with embodiments of the disclosure. The reticle 108 can include a generally circular plate 109 that carries the first and second grating patterns 108a and 108b. As shown in FIG. 2A, in certain embodiments, the first and second grating patterns 108a and 108b can be in close proximity to each other (e.g., generally abutting each other). In other embodiments, as shown in FIG. 2B, the first and second grating patterns 108a and 108b can be separated by a distance (D). In further embodiments, the first and second grating patterns 108a and 108b can also be side-by-side and/or have other geometrical arrangements. The grating patterns 108a and 108b can be generated using machining, etching, and/or other suitable techniques.

Figure 3:
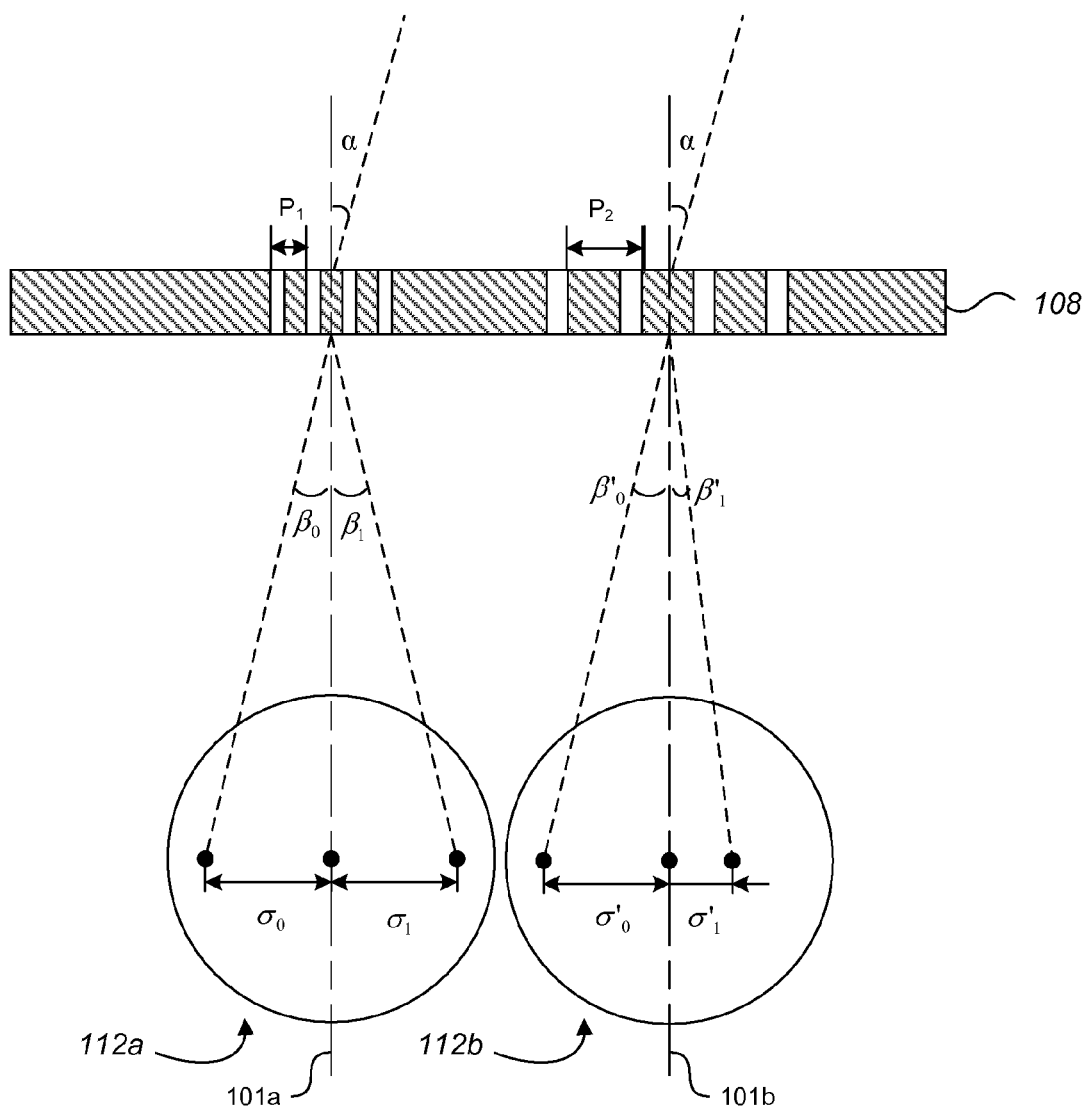
FIG. 3 is a partially schematic cross-sectional view and top view of the photolithography system of FIG. 1 in accordance with an embodiment of the disclosure.

FIG. 3 is a partially schematic cross-sectional view of the reticle 108 and top view of the photoresist 110 of FIG. 1 in accordance with an embodiment of the disclosure. For clarity, FIG. 3 only shows the reticle 108 and partial planes 112a and 112b on the photoresist 110 corresponding to the first and second grating patterns 108a and 108b, respectively. The first and second grating patterns 108a and 108b are shown separated from each other by a distance for illustration purposes. The orientation of both the first and second gratings 108a and 108b is generally perpendicular to the illumination source 102. The first grating pattern 108a can have a first pitch P1, and the second grating pattern 108b can have a second pitch P2. In other embodiments, the reticle 108 can include other grating patterns.

The first pitch P1 of the first grating pattern 108a can be configured to produce a zeroth-order refraction and a first-order refraction (denoted $\sigma_0$ and $\sigma_1$, respectively) that have generally the same value, as shown in FIG. 3. For example, the first pitch P1 can have a value calculated as follows:

$$P_1 = \frac{\lambda}{2NA_{objective}\sigma} = \frac{\lambda}{2NA_{source}} \quad \text{(Equation 4)}$$

when the zeroth-order refraction is spaced apart from a center of refraction by generally the same distance but opposite direction as the first-order refraction:

$$\sigma_0 = \sigma_1 \quad \text{(Equation 5)}$$

where $$\sigma_0 \equiv \frac{\sin\beta_0}{\sin\beta} \text{ and } \sigma_1 \equiv \frac{\sin\beta_1}{\sin\beta}.$$

Thus, the zeroth-order refraction angle $\beta_0$ generally equals the first-order refraction angle $\beta_1$. As a result, the grating equation of the zeroth-order refraction for the first grating pattern 108a can be reduced to:

$$\sin \alpha = \sin \beta_0 \quad \text{(Equation 6)}$$

The grating equation for the first-order refraction for the first grating pattern 108a can be written as:

$$P_1 = \frac{\lambda}{\sin\alpha + \sin\beta_1} \quad \text{(Equation 7)}$$

Combining Equations 5-7 yields the following:

$$P_1 = \frac{\lambda}{2\sin\alpha} = \frac{\lambda}{2\sin\beta_0} = \frac{\lambda}{2\sin\beta_1} \quad \text{(Equation 8)}$$

As a result, the zeroth-order refraction angle $\beta_0$, the first-order refraction angle $\beta_1$, and the incident angle $\alpha$ generally have the same absolute value. In certain embodiments, the zeroth-order refraction $\sigma_0$ and the first-order refraction $\sigma_1$ are configured to coincide with the partial incoherency $\sigma$ of the system 100. Thus, substituting Equations 1-3 into Equation 8 can yield Equation 4. In other embodiments, the partial incoherency $\sigma$ of the system 100 can be larger than the zeroth-order refraction $\sigma_0$ and the first-order refraction $\sigma_1$.

The second pitch P2 of the second grating pattern 108b can be configured to produce a zeroth-order refraction and a first-order refraction (denoted $\sigma'_0$ and $\sigma'_1$, respectively) that have different absolute values, as shown in FIG. 3. In certain embodiments, the zeroth-order refraction $\sigma'_0$ can be at least twice as large as the first-order refraction $\sigma'_1$. In other embodiments, the zeroth-order refraction $\sigma'_0$ can be at least five times as large as the first-order refraction $\sigma'_1$. In further embodiments, the zeroth-order refraction $\sigma'_0$ can be at least nine times as large as the first-order refraction $\sigma'_1$.

According to the grating equation for the second grating pattern 108b, the zeroth-order refraction angle $\beta'_0$ generally equals the incident angle $\alpha$. As a result, the grating equation of the zeroth-order refraction can be reduced to:

$$\sin\alpha = \sin\beta'_0 \qquad \text{(Equation 9)}$$

The grating equation for the first-order refraction for the second grating pattern 108b can be written as:

$$P_2 = \frac{\lambda}{\sin\alpha + \sin\beta'_1} \qquad \text{(Equation 10)}$$

Combining Equations 9 and 10 yields the following:

$$P_2 = \frac{\lambda}{\sin\beta'_1 + \sin\beta'_0} = \frac{\lambda}{NA_{objective}(\sigma'_0 + \sigma'_1)} \qquad \text{(Equation 11)}$$

As a result, a designer can select values for the zeroth-order refraction and the first-order refraction ($\sigma'_0$ and $\sigma'_1$, respectively) and calculate the second pitch P2 according to Equation 11.

During focus calibration, the microelectronic substrate 106 is placed onto the substrate support 104 with the photoresist 110 facing the objective lens 107. Then, the illumination source 102 illuminates the reticle 108 at an incident angle $\alpha$. The reticle 108 refracts the incident waves onto the objective lens 107 with the first and second grating patterns 108a and 108b. The objective lens 107 redirects the refracted waves onto the photoresist 110. The microelectronic substrate 106 can then be developed using a suitable chemical solution (e.g., a mixture of metol, phenidone, dimezone, and hydroquinone). The chemical solution can remove a portion of the photoresist 110 to yield first and second refraction patterns corresponding to the first and second grating patterns 108a and 108b. The developed microelectronic substrate 106 can then be inspected with a critical dimension scanning electron microscope (CDSEM) and/or other suitable metrology tool. The metrology tool can be used to measure an image shift ($\Delta x$) between the first and second refraction patterns on the photoresist 110.

Without being bound by theory, it is believed that the defocus phase shift ($\Delta\phi$) of the zeroth-order and the first-order diffraction of a grating pattern is governed by the following formula:

$$\Delta\phi = \frac{2\pi}{\lambda} def * \sqrt{n^2 - (NA_{objective} * \sigma)^2} \qquad \text{(Equation 12)}$$

where def is the focus shift, and n is the medium index of fraction. The derivation of Equation 12 is described below with reference to FIG. 4, which is a partially schematic top view of the photoresist 110 of FIG. 1 in different focal conditions.

Figure 4:
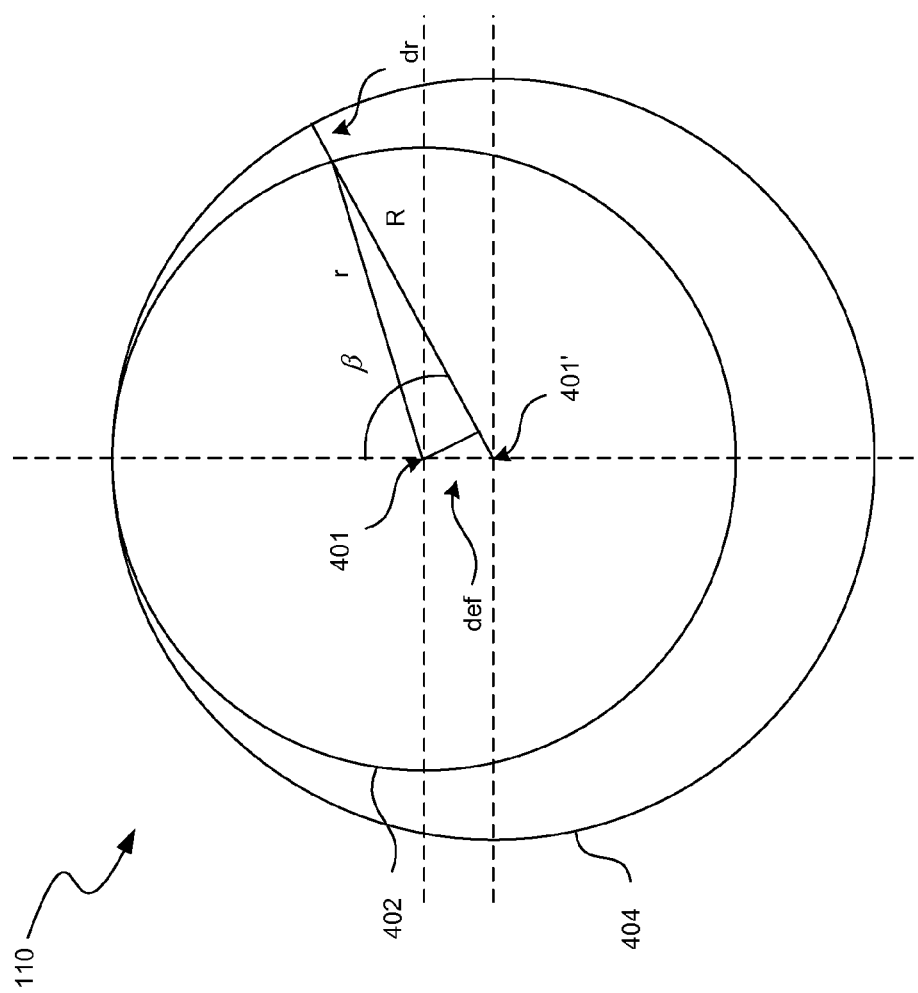
FIG. 4 is a partially schematic top view of the photolithography system of FIG. 1 in different focal conditions in accordance with an embodiment of the disclosure.

As shown in FIG. 4, if the illumination source 102 is best focused onto the photoresist 110, spherical waves from the illumination source 102 can produce a first circle 402 with a focus center 401 and a first radius of r. If the illumination source 102 is defocused, then different spherical waves from the illumination source 102 can produce a second circle 404 with a second focus center 401' and a second radius of R. The amount of focus shift (def) is the distance between the first and second focus centers 401 and 401'. Thus, the difference between the first and second circles 402 and 404 at an incident angle of $\alpha$ can be expressed as follows:

$$dr = (r + def) - def * \cos(\alpha) - r = def - def * \sqrt{1 - \sin^2(\alpha)} \qquad \text{(Equation 13)}$$

Combining Equation 13 with Equations 1-3 yields:

$$dr = def - def * (1/n)\sqrt{n^2 - (NA_{object}\sigma)^2} \qquad \text{(Equation 14)}$$

An optical path difference (OPD) is defined as:

$$OPD = def - dr \qquad \text{(Equation 15)}$$

and the defocus phase shift ($\Delta\phi$) is related to the optical path difference as follows:

$$OPD = def * \left(\frac{1}{n}\right)\sqrt{n^2 - (NA_{objective}\sigma)^2} \qquad \text{(Equation 16)}$$

Thus, combining Equations 14-16 yields Equation 12.

As discussed above, the first grating pattern 108a is configured such that $\sigma_0 = \sigma_1$. Thus, based on Equation 12, the defocus phase shift ($\Delta f$) of the zeroth-order refraction is equal to that of the first-order diffraction: $\Delta\phi_1 = \Delta\phi_0$. The image shift ($\Delta x$) of the first grating pattern 108a can be calculated by performing Fourier transformation of the zeroth and the first order diffraction pattern as follows:

$$\Delta x = (\Delta\phi_1 - \Delta\phi_0) * \frac{p}{2\pi} = 0 \qquad \text{(Equation 17)}$$

As a result, the image of the first grating pattern 108a would not shift at the defocus plane.

The image of the second grating pattern 108b, however, would shift at the defocus plane. It is believed that the defocus phase shift ($\Delta\phi$) of the zeroth-order refraction and the first-order diffraction of the second grating pattern 108a is as follows:

$$\Delta\phi_0 = \frac{2\pi}{\lambda} def * \sqrt{n^2 - (NA_{objective} * \sigma'_0)^2} \qquad \text{(Equation 18)}$$

$$\Delta\phi_1 = \frac{2\pi}{\lambda} def * \sqrt{n^2 - (NA_{objective} * \sigma'_1)^2} \qquad \text{(Equation 19)}$$

Thus, the image shift ($\Delta x'$) can be expressed as:

$$\Delta x' = (\Delta\phi_1 - \Delta\phi_0) * \frac{p}{2\pi} \qquad \text{(Equation 20)}$$

Combining Equations 12 and 17-19, the image shift can be expressed as a function of the focus shift as follows:

$$\Delta x' = \frac{def}{NA_{objective} * (\sigma'_0 + \sigma'_1)} * \left(\sqrt{n^2 - (NA_{objective} * \sigma'_1)^2} - \sqrt{n^2 - (NA_{objective} * \sigma'_0)^2}\right) \qquad \text{(Equation 21)}$$

As a result, the focus shift (def) at the imaging plane (i.e., the photoresist 110) can be derived based on the measured image shift (Δx'), and the first grating pattern 108a can be used as a reference for determining the image shift.

In certain embodiments, the derived focus shift (def) can then be used to adjust the focus curvature of the illumination source 102, movement of the substrate support 104, and/or other operations of the system 100. In other embodiments, if the image shift has a finite value, it can be indicated that the illumination source 102 is out of focus. In other embodiments, if the image shift is within a predetermined threshold (e.g., 5 nm), then it can be indicated that the illumination source 102 is in focus.

Several embodiments of the system 100 can determine a defocus phase shift of an illumination source more efficiently and accurately than conventional techniques. According to one conventional technique, two reticles with different patterns are sequentially exposed to derive an defocus phase shift. Such sequential exposures are time-consuming and susceptible to device drift and/or other environmental influences, resulting in unreliable measurements. Several embodiments of the system 100 can determine the defocus phase shift with only one exposure. As a result, the amount of time required for calibrating the system 100 can be reduced, and the reliability of the calibration can be improved.

A specific example of applying the calibration process is described with reference to FIGS. 5A-C, which are schematic top views of the first and second refraction patterns 508a and 508b under various defocus conditions. Specific values of illumination wavelength, medium index of refraction, numerical apertures, and other parameters were used for illustration purposes only. One skilled in the art will understand that these parameters can also have other desired values based on the particularities of a photolithography system.

In the illustrated example, the following parameter values were used:

$\lambda = 193$ nm $n = 1.43664$ $NA_{objective} = 1.34$ $P_1 = 0.080$ (μm)

$P_2 = 0.144$ (μm)

$\sigma_0 = \sigma_1 = \sigma'_0 = 0.9$ $\sigma'_1 = 0.1$

As shown in FIG. 5A, when the illumination source 102 is substantially focused on the photoresist 110, the image of the first and second grating patterns 508a and 508b are generally aligned with each other. As a result, the image shift (Δx) equals to zero. As shown in FIG. 5B, as the illumination source 102 is defocused, the image shift (Δx) has a finite value of 24 nm. Using Equation 20 and the parameters listed above, the focus shift (def) can be calculated to be about 0.05 μm. As shown in FIG. 5C, as the illumination source 102 becomes more defocused, the image shift (Δx) now has a larger value of 48 nm. Again, using Equation 20 and the parameters listed above, the focus shift (def) can be calculated to be about 0.1 μm. Even though the defocus of the illumination source 102 is described above as proceeding in only one direction, the calibration process described above can also be applied when the illumination source 102 is defocused in the opposite direction.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

We claim:

1. A method for calibrating a photolithography system, the method comprising:
   simultaneously illuminating first and second grating patterns of a single reticle with an asymmetric monopole illumination source perpendicular to the first and second gratings, wherein the first grating pattern has a first pitch, and wherein the second grating pattern has a second pitch different from the first pitch;
   producing first and second refraction patterns on the photoresist layer corresponding to first and second grating patterns, respectively, wherein the first refraction pattern has refraction angles of at least two different refraction orders that are at least substantially equal to each other, and wherein the second refraction pattern has refraction angles of at least two different refraction orders that are different from each other;
   measuring an image shift between the first and second refraction patterns on the photoresist layer; and
   determining a defocus shift of the illumination source based on the image shift.

2. The method of claim 1 wherein the photolithography system further includes an objective lens between the microelectronic substrate and the reticle, the objective lens having a numerical aperture ($NA_{objective}$), and wherein exposing a photoresist layer includes
   passing light with a single frequency (λ) concurrently through the first and second gratings;
   refracting the light with the first and second grating patterns on the reticle, wherein the first pitch (P1) of the first grating pattern is configured as follows:

$$P_1 = \frac{\lambda}{2NA_{source}}$$

and wherein the second pitch (P2) of the second grating pattern is different from the first pitch (P1);
   and wherein determining a defocus shift includes calculating the defocus shift (def) according to:

$$\Delta x = \frac{def}{NA_{objective} * (\sigma'_0 + \sigma'_1)} * \left( \sqrt{n^2 - (NA_{objective} * \sigma'_1)^2} - \sqrt{n^2 - (NA_{objective} * \sigma'_0)^2} \right)$$

where Δx is the image shift, n is the index of refraction of a medium in which the photolithography system is disposed, and $\sigma'_0$, $\sigma'_1$ are zeroth-order and first-order refractions of the second grating pattern.

3. The method of claim 1 wherein the first grating pattern is configured such that a value of a zeroth-order refraction angle and a value of a first-order refraction angle of the first grating pattern are at least substantially equal to each other, and wherein producing first and second refraction patterns includes producing a first refraction pattern that does not change with respect to the defocus shift.

4. The method of claim 1, further comprising producing a light with a single frequency (λ), and configuring the first pitch of the first grating pattern based at least in part on the frequency (λ) of the light such that a value of a zeroth-order refraction angle and a value of a first-order refraction angle of the first grating pattern are at least substantially equal to each other.

5. The method of claim 1 wherein the first grating pattern is configured such that a value of a zeroth-order refraction angle and a value of a first-order refraction angle of the first grating pattern are at least substantially equal to each other, and wherein the second grating pattern is configured such that a first-order refraction angle of the second grating pattern is at least twice as much as a zeroth-order refraction angle of the second grating pattern, and further wherein producing first and second refraction patterns includes producing a first refraction pattern that does not change with respect to the defocus shift and producing a second refraction pattern that changes with respect to the defocus shift.

6. A method for calibrating a photolithography system, the method comprising:
irradiating a reticle with a radiation; and
producing a first refraction pattern and a second refraction pattern with the reticle, wherein the first refraction pattern has a zeroth-order refraction angle and a first-order refraction angle that are at least substantially equal to each other, wherein the second refraction pattern has a zeroth-order refraction angle and a first-order refraction angle that are different from each other, and wherein the first and second refraction patterns have first and second pitches, respectively, that are different from one another.

7. The method of claim 6 wherein irradiating a reticle with a light includes irradiating a reticle with a light that is generally coherent and at an incident angle with respect to the reticle, and wherein the first refraction pattern has a zeroth-order refraction angle and a first-order refraction angle that are at least substantially equal to the incident angle of the illuminating light.

8. The method of claim 6 wherein irradiating a reticle with a light includes irradiating a reticle with a light that is generally coherent and at an incident angle with respect to the reticle, and wherein the first refraction pattern has a zeroth-order refraction angle and a first-order refraction angle that are at least substantially equal to the incident angle of the illuminating light, and wherein the first and second refraction patterns have at least substantially the same zeroth-order refraction angle.

9. The method of claim 6 wherein the first and second refraction patterns have at least substantially the same zeroth-order refraction angle, and wherein the second refraction pattern has a zeroth-order refraction angle ($\beta'_0$) and a first-order refraction angle ($\beta'_1$) related to each other as follows:

$\sin \beta'_0 \leq 2 \sin \beta'_1$.

10. The method of claim 6 wherein the first and second refraction patterns have at least substantially the same zeroth-order refraction angle, and wherein the second refraction pattern has a zeroth-order refraction angle ($\beta'_0$) and a first-order refraction angle ($\beta'_1$) related to each other as follows:

$\sin \beta'_0 \approx 9 \sin \beta'_1$.

11. The method of claim 6, further comprising:
exposing a photoresist on the microelectronic substrate to the first and second refraction patterns;
measuring an image shift between the first and second refraction patterns on the photoresist layer; and
calculating a defocus shift of the illumination source based on the image shift.

12. A method for calibrating a photolithography system, the method comprising:
producing a light from an illumination source;
producing a static refraction from the light, the static refraction being non-shifting with respect to a defocus shift of the illumination source;
producing a dynamic refraction from the light, the dynamic refraction being able to shift in response to the defocus shift of the illumination source;
exposing a photoresist on a microelectronic substrate to the static and dynamic refraction in a single exposure; and
creating a first pattern and a second pattern on the photoresist from the single exposure, the first pattern having a first pitch and the second pattern having a second pitch different from the first pitch, wherein the first refraction pattern has refraction angles of at least two different refraction orders that are at least substantially equal to each other, and wherein the second refraction pattern has refraction angles of at least two different refraction orders that are different from each other.

13. The method of claim 12, further comprising:
detecting an image shift between the first and second patterns; and
determining a focus shift of the illumination source based on the image shift.

14. The method of claim 12, further comprising:
detecting an image shift between the first and second patterns; and
indicating that the illumination source is out of focus if the image shift has a finite value.

15. The method of claim 12, further comprising:
detecting an image shift between the first and second patterns; and
indicating that the illumination source is in focus if the image shift is within a threshold.

16. A photolithography system, comprising:
an illumination source configured to produce a generally coherent light with a single frequency (λ);
a substrate support facing the illumination source, the substrate support being configured to support a microelectronic substrate;
a reticle between the illumination source and the substrate support, the reticle having a first grating pattern and a second grating pattern adjacent to the first grating pattern;
an objective lens between the substrate support and the reticle, and
wherein the first grating pattern has a first pitch (P1) at least substantially equal to a value calculated as follows:

$$P_1 = \frac{\lambda}{2NA_{source}}$$

where ($NA_{source}$) is a numerical aperture of the illumination source; and
wherein the second grating pattern has a second pitch (P2) different than the first pitch (P1).

17. The photolithography system of claim 16 wherein the first and second grating patterns are in close proximity to each other.

18. The photolithography system of claim 16 wherein the first and second grating patterns are spaced apart from each other.

19. The photolithography system of claim 16 wherein the illumination source is off-axis with respect to a normal plane of the reticle.

* * * * *

UNITED STATES PATENT AND TRADEMARK OFFICE
CERTIFICATE OF CORRECTION

PATENT NO. : 8,184,264 B2
APPLICATION NO. : 12/325929
DATED : May 22, 2012
INVENTOR(S) : Chung-Yi Lee et al.

Page 1 of 1

It is certified that error appears in the above-identified patent and that said Letters Patent is hereby corrected as shown below:

On the title page, in item (73), in "Assignee", in column 1, line 1, delete "Technologies," and insert -- Technology, --, therefor.

In column 9, line 50, in Claim 9, delete "sin $\beta'_0 \leq 2$ sin $\beta'_1$." and insert -- sin $\beta'_0 \geq 2$ sin $\beta'_1$. --, therefor.

Signed and Sealed this
Thirty-first Day of July, 2012

David J. Kappos
*Director of the United States Patent and Trademark Office*